(12) United States Patent
Yoo et al.

(10) Patent No.: US 11,296,004 B2
(45) Date of Patent: Apr. 5, 2022

(54) SEMICONDUCTOR PACKAGE INCLUDING HEAT REDISTRIBUTION LAYERS

(71) Applicant: SAMSUNG ELECTRONICS CO., LTD., Suwon-si (KR)

(72) Inventors: Taewon Yoo, Suwon-si (KR); Hyunsoo Chung, Suwon-si (KR); Myungkee Chung, Suwon-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 120 days.

(21) Appl. No.: 16/710,841

(22) Filed: Dec. 11, 2019

(65) Prior Publication Data

US 2020/0373216 A1 Nov. 26, 2020

(30) Foreign Application Priority Data

May 21, 2019 (KR) .................... 10-2019-0059635

(51) Int. Cl.
| | |
|---|---|
| *H01L 23/36* | (2006.01) |
| *H01L 23/48* | (2006.01) |
| *H01L 23/31* | (2006.01) |
| *H01L 23/00* | (2006.01) |
| *H01L 25/065* | (2006.01) |

(52) U.S. Cl.
CPC .......... *H01L 23/36* (2013.01); *H01L 23/3185* (2013.01); *H01L 23/481* (2013.01); *H01L 24/05* (2013.01); *H01L 24/29* (2013.01); *H01L 25/0655* (2013.01); *H01L 2224/02372* (2013.01)

(58) Field of Classification Search
CPC ..... H01L 2225/1058; H01L 2225/1094; H01L 23/36; H01L 23/28; H01L 23/345
See application file for complete search history.

(56) References Cited

U.S. PATENT DOCUMENTS

| | | | |
|---|---|---|---|
| 9,318,474 B2 | 4/2016 | Zhai et al. | |
| 9,391,009 B2 | 7/2016 | Jang et al. | |
| 9,768,145 B2 | 9/2017 | Yu et al. | |
| 10,192,855 B2 | 1/2019 | Seo et al. | |
| 2010/0213601 A1* | 8/2010 | Smeys | H01L 24/24 257/698 |
| 2012/0068328 A1* | 3/2012 | Chen | H01L 23/49827 257/693 |
| 2016/0276308 A1* | 9/2016 | Min | H01L 23/3128 |
| 2018/0358317 A1 | 12/2018 | Albers et al. | |
| 2019/0006263 A1 | 1/2019 | Yu et al. | |
| 2019/0051604 A1 | 2/2019 | Yu et al. | |

* cited by examiner

*Primary Examiner* — Dale E Page
*Assistant Examiner* — Wilner Jean Baptiste
(74) *Attorney, Agent, or Firm* — F. Chau & Associates, LLC

(57) ABSTRACT

A semiconductor package is provided including a first semiconductor package including a first semiconductor chip. The first semiconductor chip includes a first surface and a second surface opposite to the first surface. A second semiconductor package is disposed on the first semiconductor package. The second semiconductor package includes a second redistribution layer including a redistribution line. A second semiconductor chip is disposed on the second redistribution layer. A thermal pillar is disposed on the second redistribution layer. A heat radiator is disposed on the second semiconductor package and connected to the thermal pillar. The redistribution line is connected to the first semiconductor chip.

12 Claims, 16 Drawing Sheets

US 11,296,004 B2

SEMICONDUCTOR PACKAGE INCLUDING HEAT REDISTRIBUTION LAYERS

CROSS-REFERENCE TO RELATED APPLICATION

This U.S. non-provisional utility patent application claims priority under 35 U.S.C § 119 to Korean Patent Application No. 10-2019-005%35 filed on May 21, 2019 in the Korean Intellectual Property Office, the disclosure of which is incorporated by reference herein in its entirety.

TECHNICAL FIELD

The present inventive concept relates to a semiconductor package, and more particularly, to a semiconductor package including heat redistribution layers.

DISCUSSION OF THE RELATED ART

Electronic devices are designed to be increasingly low price, light weight, compact, high speed, and high performance.

A semiconductor package is provided to implement an integrated circuit chip for use in electronic products. However, semiconductor packages are not without shortcomings. In particular, highly integrated semiconductor packages are more prone to thermal stress. Thermal characteristics of the semiconductor package have been increasingly important because of heat generated by progressively increased power consumption resulting from high speed and high capacity semiconductor packages.

SUMMARY

According to an exemplary embodiment of the present inventive concept, a semiconductor package is provided including a first semiconductor package. The first semiconductor package includes a first semiconductor chip. The first semiconductor chip includes a first surface and a second surface opposite to the first surface. A second semiconductor package is disposed on the first semiconductor package. The second semiconductor package includes a second redistribution layer including a redistribution line. A second semiconductor chip is disposed on the second redistribution layer. A thermal pillar is disposed on the second redistribution layer. A heat radiator is disposed on the second semiconductor package and connected to the thermal pillar. The redistribution line is connected to the first semiconductor chip.

According to an exemplary embodiment of the present inventive concept, a first semiconductor package is provided including a first redistribution layer. A first semiconductor chip is disposed on the first redistribution layer. An adhesive film covers a first surface of the first semiconductor chip. A second semiconductor package is disposed on the first semiconductor package. The second semiconductor package includes a second redistribution layer that is disposed on the adhesive film and includes a redistribution line. A second semiconductor chip is disposed on the second redistribution layer. A thermal pillar is disposed on the second redistribution layer adjacent to one side of the second semiconductor chip. A heat radiator is disposed on the second semiconductor package and connected to the thermal pillar. The redistribution line penetrates the adhesive film and is thermally connected to the first semiconductor chip.

According to an exemplary embodiment of the present inventive concept, a semiconductor package is provided comprising a first semiconductor package. A plurality of redistribution lines are thermally connected to the first semiconductor package. Thermal pillars are thermally connected to at least some redistribution lines of the plurality of redistribution lines, and an externally exposed heat radiator is thermally connected to the thermal pillars.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Figure 1:
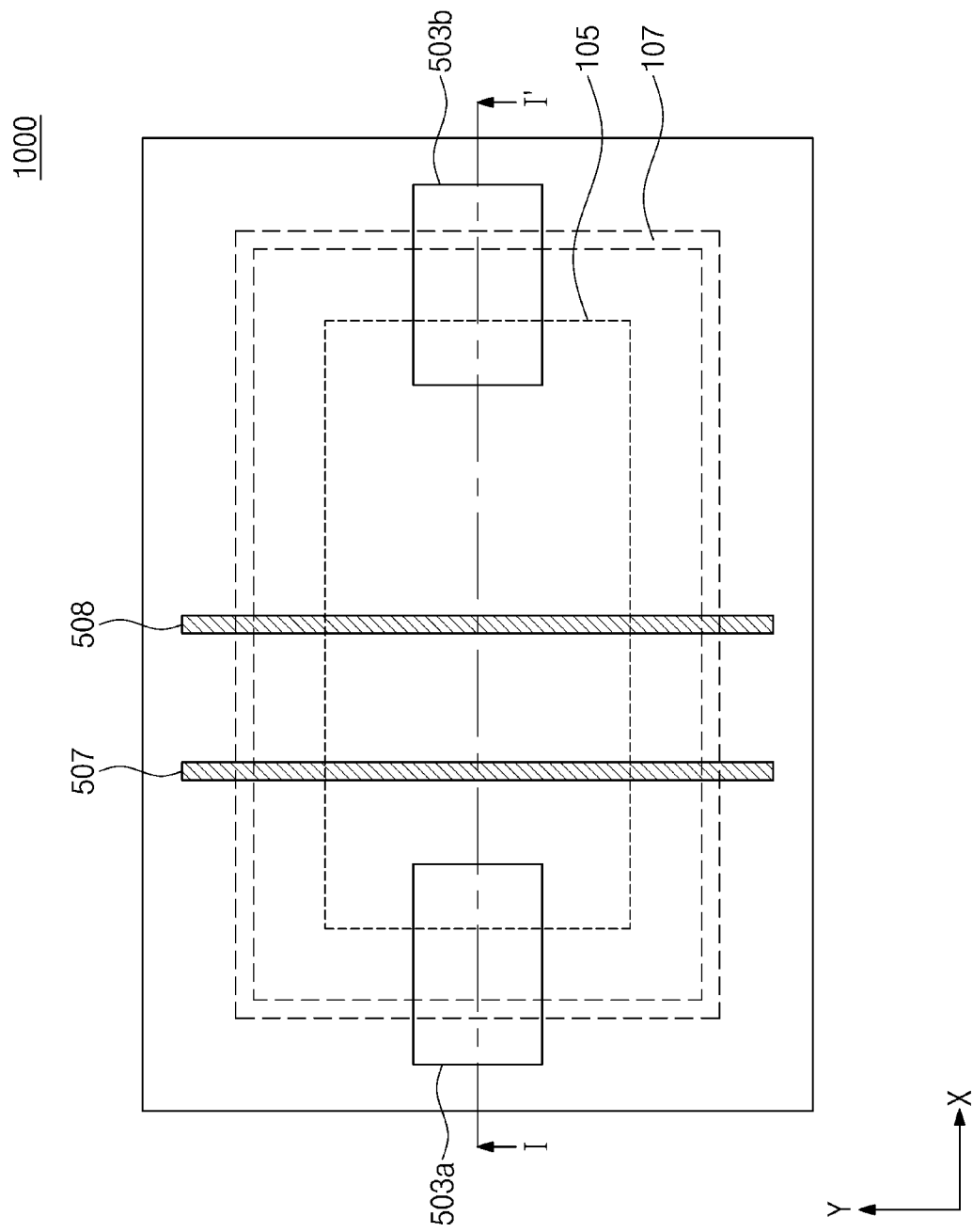
FIG. 1 illustrates a plan view illustrating a semiconductor package according to an exemplary embodiment of the present inventive concept.
Figure 2:
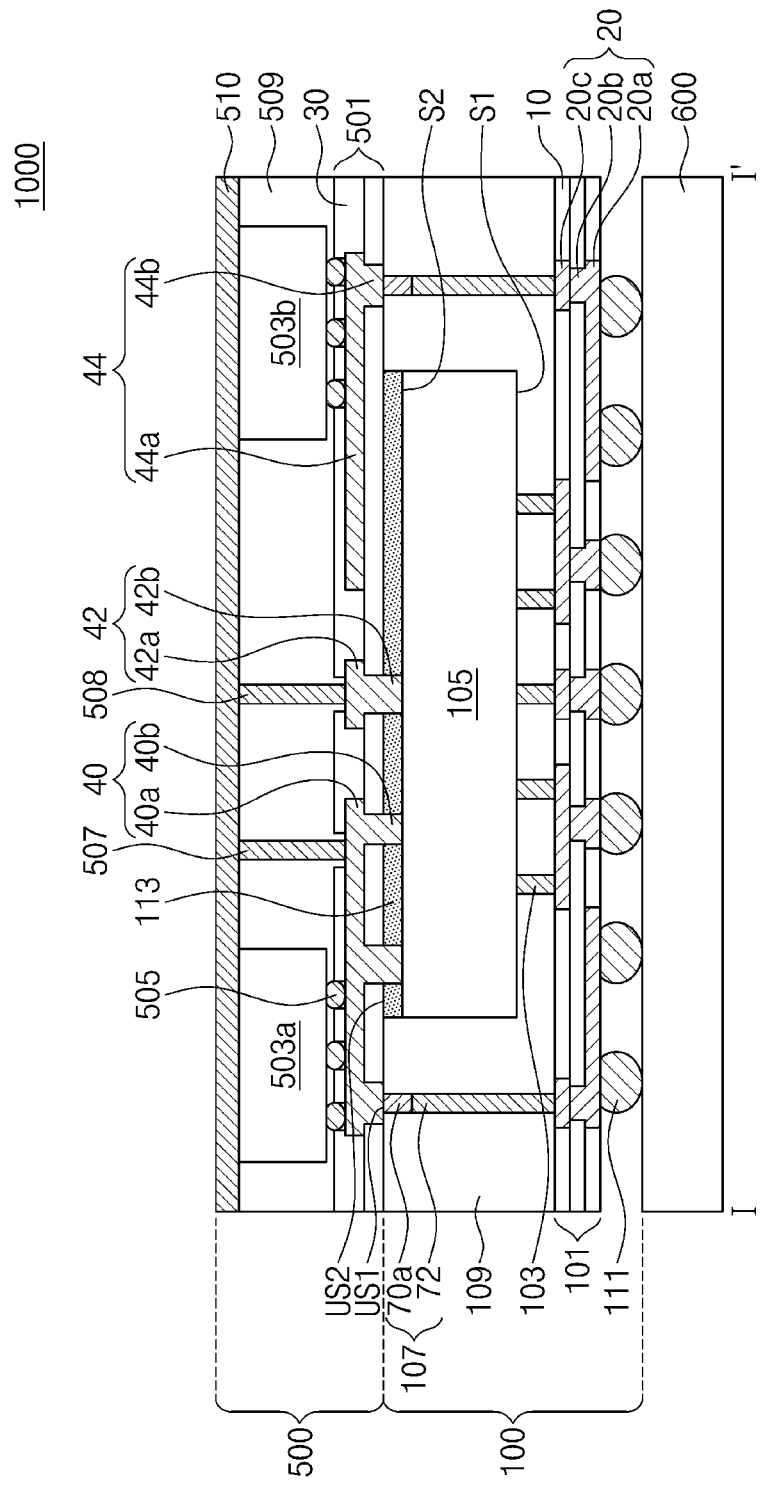
FIG. 2 illustrates a cross-sectional view taken along line I-I' of FIG. 1, illustrating a semiconductor package according to an exemplary embodiment of the present inventive concept.

FIG. 1 illustrates a plan view illustrating a semiconductor package 1000 according to an exemplary embodiment of the present inventive concept. FIG. 2 illustrates a cross-sectional view taken along line I-I' of FIG. 1, illustrating a semiconductor package 1000 according to some exemplary embodiments of the present inventive concept.

Referring to FIGS. 1 and 2, a semiconductor package 1000 may include a first semiconductor package 100 and a second semiconductor package 500. The second semiconductor package 500 may be stacked on the first semiconductor package 100. The first semiconductor package 100 may be a lower semiconductor package, and the second semiconductor package 500 may be an upper semiconductor package. For example, the first semiconductor package 100 and the second semiconductor package 500 may both be disposed on a board 600, and the first semiconductor package 100 may be disposed adjacent to the board 600 with the second semiconductor package 500 disposed thereon.

The first semiconductor package 100 may include a first redistribution layer 101, first terminals 103, a first semiconductor chip 105, a first connection pillar 107, a first molding layer 109, external terminals 111, and an adhesive film 113. The first redistribution layer 101 may include at least one first dielectric layer 10 and a plurality of lower redistribution lines 20. Portions of the lower redistribution lines 20 may be used as pads 20c in direct contact with the first terminals 103. The lower redistribution lines 20 constituting the pads 20c may be disposed in an uppermost first dielectric layer 10 adjacent to the first semiconductor chip 105. Other portions of the lower redistribution lines 20 may include connection lines 20a and lower vias 20b. The lower vias 20b may be disposed in one of the first dielectric layers 10 (e.g., a middle first dielectric layer 10 disposed between the uppermost dielectric layer 10 and a lowermost dielectric layer 10 adjacent to the board 600), and the connection lines 20a may horizontally extend from ends of the lower vias 20b and may be disposed on one of the first dielectric layers 10. The lower redistribution lines 20 may include at least one metallic material (e.g., copper, tungsten, aluminum, etc.). The first dielectric layers 10 may include, for example, one or more of a silicon oxide layer, a silicon nitride layer, and a silicon oxynitride layer.

The first semiconductor chip 105 may be disposed on the first redistribution layer 101. The first semiconductor chip 105 may be a semiconductor logic chip. The first semiconductor chip 105 may include a first surface S1 and a second surface S2 opposite to each other. The first surface S1 of the first semiconductor chip 105 may be disposed adjacent to the first redistribution layer 101, and the second surface S2 of the first semiconductor chip 105 may be disposed adjacent to the second semiconductor package 500. The first surface S1 may be a bottom surface of the first semiconductor chip 105, and the second surface S2 may be a top surface of the first semiconductor chip 105. The first surface S1 may be an active surface of the first semiconductor chip 105, and the second surface S2 may be an inactive surface of the first semiconductor chip 105.

The first terminals 103 may be disposed between the first redistribution layer 101 and the first surface S1 of the first semiconductor chip 105. The first terminals 103 may contact the pads 20c of the lower redistribution lines 20 disposed in the uppermost first dielectric layer 10. The first semiconductor chip 105 may thus be electrically connected through the first terminals 103 to the lower redistribution lines 20. The first terminals 103 may include metal fillers. The first terminals 103 may include a plurality of layers. The first terminals 103 may include, for example, one or more of copper (Cu), nickel (Ni), molybdenum (Mo), platinum (Pt), titanium (Ti), and aluminum (Al).

The first connection pillar 107 may be disposed on an edge of the first redistribution layer 101. The first redistribution layer 101 may be provided thereon with the first connection pillar 107 that is spaced apart from the first semiconductor chip 105. The first connection pillar 107 surrounds at least one lateral surface of the first semiconductor chip 105. The first connection pillar 107 may physically and/or electrically connect to at least one of the pads 20c of the lower redistribution lines 20 disposed in the uppermost first dielectric layer 10 of the first redistribution layer 101. The second surface S2 of the first semiconductor chip 105 may be located at a level lower than a level of a top surface US1 of the first connection pillar 107. The top surface US1 is adjacent to the second semiconductor package 500. The first connection pillar 107 may include metal fillers. The first connection pillar 107 may include a first metal pattern 70a and a second metal pattern 72. The first metal pattern 70a may be disposed adjacent to the second semiconductor package 500, and the second metal pattern 72 may be disposed between the first metal pattern 70a and the first redistribution layer 101. The first metal pattern 70a may include, for example, one or more of copper (Cu), nickel (Ni), molybdenum (Mo), platinum (Pt), titanium (Ti), and aluminum (Al). The second metal pattern 72 may include, for example, copper (Cu).

The adhesive film 113 may be disposed on the second surface S2 of the first semiconductor chip 105. The adhesive film 113 may contact the second surface S2 of the first semiconductor chip 105. The adhesive film 113 may have a width substantially the same as a width of the first semiconductor chip 105. The adhesive film 113 may have a top surface US2 that is coplanar with the top surface US1 of the first connection pillar 107. The top surface US2 may be adjacent to the second semiconductor package 500. For example, the top surface US2 of the adhesive film 113 may be disposed on the second redistribution layer 501. The adhesive film 113 may be, for example, an epoxy, a silicon-based dielectric layer, or a tape.

The first molding layer 109 may be disposed on the first redistribution layer 101. The first molding layer 109 may cover lateral surfaces of the first semiconductor chip 105, sidewalls of the adhesive film 113, sidewalls of the first connection pillar 107, a top surface of the first redistribution layer 101, and sidewalls of the first terminals 103. The first molding layer 109 may fill a space between the first semiconductor chip 105 and the first redistribution layer 101. The first molding layer 109 may have a top surface that is coplanar with the top surface US1 of the first connection pillar 107 and/or with the top surface US2 of the adhesive film 113. The first molding layer 109 may include a dielectric polymeric material, such as an epoxy molding compound.

The external terminals 111 may be disposed on a bottom surface of the first redistribution layer 101. For example, the external terminals 111 may be disposed on a surface of the first redistribution layer 101 that is opposite to the side connected to the first surface S1 of the first semiconductor chip 105. The external terminals 111 may contact the connection lines 20a of the lower redistribution lines 20. The connection lines 20a are disposed in a lowermost first dielectric layer 10. The external terminals 111 may be electrically connected to the lower redistribution lines 20. The external terminals 11 may include, for example, solder bumps and/or solder balls. The external terminals 111 may include, for example, one or more of copper (Cu), silver (Ag), platinum (Pt), aluminum (Al), and copper (Cu).

The second semiconductor package 500 may include the second redistribution layer 501, a second semiconductor chip 503a and a third semiconductor chip 503b, a first thermal pillar 507 and a second thermal pillar 508, a second molding layer 509, and a heat radiator 510. The second redistribution layer 501 may be disposed on the first semiconductor package 100. The second redistribution layer 501 may be in contact with the top surface of the first molding layer 109 and with the top surface US2 of the adhesive film 113. The second redistribution layer 501 may have a width greater than a width of the adhesive film 113. The second redistribution layer 501 may include at least one second dielectric layer 30 and a plurality of upper redistribution lines 40, 42, and 44. The second dielectric layers 30 may be sequentially stacked on the first semiconductor package 100. The upper redistribution lines 40, 42, and 44 may be disposed in the second dielectric layers 30. The upper redistribution lines 40, 42, and 44 may include a metallic material (e.g., copper, tungsten, aluminum, etc.). The second dielectric layers 30 may include, for example, one or more of a silicon oxide layer, a silicon nitride layer, and a silicon oxynitride layer.

The upper redistribution lines 40, 42, and 44 may include a first upper redistribution line 40, a second upper redistribution line 42, and a third upper redistribution line 44. The first upper redistribution line 40 may include a first connection line 40a and first vias 40b at least partially covered by an upper second dielectric layer 30. The first upper redistribution line 40 may include the first connection line 40a which horizontally extends from upper ends of the first vias 40b and is disposed across a top surface of a lower second dielectric layer 30 adjacent to the first semiconductor package 100. At least one of the first vias 40b of the first upper redistribution line 40 may penetrate through the lower second dielectric layer 30 adjacent to the first semiconductor package 100 and may contact the top surface US1 of the first connection pillar 107 disposed on a first side of the first semiconductor chip 105. The first connection pillar 107 may be electrically connected to the first vias 40b of the first upper redistribution line 40 that are in contact with the top surface US1 of the first connection pillar 107. At least one of the first vias 40b of the first upper redistribution line 40 may penetrate through the adhesive film 113 and the lower second dielectric layer 30 adjacent to the first semiconductor package 100, and may directly contact the second surface S2 of the first semiconductor chip 105. The first semiconductor chip 105 may be thermally connected to the first vias 40b of the first upper redistribution line 40 that are in contact with the second surface S2 of the first semiconductor chip 105. According to an exemplary embodiment of the present inventive concept, the first vias 40b of the first upper redistribution line 40 that are in contact with the second surface S2 of the first semiconductor chip 105 may be disposed on locations in which a large quantity of heat is generated from the first semiconductor chip 105. Thus, the first upper redistribution line 40 may be used as a thermal pathway through which heat generated from the first semiconductor chip 105 is discharged.

The second upper redistribution line 42 may include a second connection line 42a and a second via 42b. The second upper redistribution line 42 may include the second connection line 42a that horizontally extends from an upper end of the second via 42b and is disposed on the top surface of the second dielectric layer 30 adjacent to the first semiconductor package 100. The second via 42b of the second upper redistribution line 42 may penetrate through the adhesive film 113 and the second dielectric layer 30 adjacent to the first semiconductor package 100, and may directly contact the second surface S2 of the first semiconductor chip 105. The second via 42b of the second upper redistribution line 42 may be thermally connected to the first semiconductor chip 105. According to an exemplary embodiment of the present inventive concept, the second via 42b of the second upper redistribution line 42 may be disposed on a location in which a large quantity of heat is generated from the first semiconductor chip 105. Thus, the second upper redistribution line 42 may be used as a thermal pathway through which heat generated from the first semiconductor chip 105 is discharged.

The third upper redistribution line 44 may include a third connection line 44a and a third via 44b. The third upper redistribution line 44 may include the third connection line 44a that horizontally extends from an end of the third via 44b and is disposed on the top surface of the second dielectric layer 30 adjacent to the first semiconductor package 100. The third via 44b of the third upper redistribution line 44 may penetrate through the second dielectric layer 30 adjacent to the first semiconductor package 100, and may contact the top surface US1 of the first connection pillar 107 disposed on a second side opposite to the first side of the first semiconductor chip 105. The third via 44b of the third upper redistribution line 44 may be electrically connected to the first connection pillar 107.

The second semiconductor chip 503a and the third semiconductor chip 503b may be disposed on the second redistribution layer 501. The second semiconductor chip 503a and the third semiconductor chip 503b may be disposed spaced apart from each other in the first direction (e.g., the X-direction). The second semiconductor chip 503a may be disposed on the first upper redistribution line 40, and the third semiconductor chip 503b may be disposed on the third upper redistribution line 44. The second semiconductor chip 503a and the third semiconductor chip 503b may be memory chips.

Second terminals 505 may be disposed between the second semiconductor chip 503a and the first upper redistribution line 40 and between the third semiconductor chip 503b and the third upper redistribution line 44. The second terminals 505 below the second semiconductor chip 503a may contact portions of the first connection line 40a of the first upper redistribution line 40. The contacted portions of the first connection line 40a are exposed by the second dielectric layer 30 adjacent to the second semiconductor chip 503a and the third semiconductor chip 503b. The second semiconductor chip 503a may therefore be electrically connected to the first upper redistribution line 40. The second terminals 505 below the third semiconductor chip 503b may contact portions of the third connection line 44a of the third upper redistribution line 44. The contacted portions of the third connection line 44a are exposed by the second dielectric layer 30 adjacent to the second semiconductor chip 503a and the third semiconductor chip 503b. The third semiconductor chip 503b may therefore be electrically connected to the third upper redistribution line 44. The second terminals 505 of the second semiconductor chip 503a may share the first connection line 40a of the first upper redistribution line 40. For example, the first upper redistribution line 40 may be a signal line. The second terminals 505 of the third semiconductor chip 503b may share the third connection line 44a of the third upper redistribution line 44. For example, the third upper redistribution line 44 may be a signal line. The first semiconductor chip 105 and the second semiconductor chip 503a may be electrically connected to each other through the first connection pillar 107 and the first upper redistribution line 40. The first semiconductor chip 105 and the third semiconductor chip 503b may be electrically connected to each other through the first connection pillar 107 and the third upper redistribution line 44. The second terminals 505 may include, for example, solder bumps and/or solder balls. The second terminals 505 may include, for example, one or more of copper (Cu), silver (Ag), platinum (Pt), aluminum (Al), and copper (Cu).

The first thermal pillar 507 and the second thermal pillar 508 may be disposed on the second redistribution layer 501. The first thermal pillar 507 may contact a portion of the first connection line 40a of the first upper redistribution line 40. The contacted portion of the first connection line 40a is exposed by the second dielectric layer 30 adjacent to the second semiconductor chip 503a and the third semiconductor chip 503b. The first thermal pillar 507 may thus be electrically/thermally connected to the first upper redistribution line 40. The second thermal pillar 508 may contact a portion of the third connection line 44a of the third upper redistribution line 44. The contacted portion of the third connection line 44a is exposed by the second dielectric layer 30 adjacent to the second semiconductor chip 503a and the third semiconductor chip 503b. The second thermal pillar 508 may thus be electrically/thermally connected to the second upper redistribution line 42. The first thermal pillar 507 and the second thermal pillar 508 may be disposed between the second semiconductor chip 503a and the third semiconductor chip 503b. Each of the first thermal pillar 507 and the second thermal pillar 508 may have a linear shape that extends in the second direction (e.g., the Y-direction) intersecting the first direction (e.g., the X-direction). For example, in a plan view, the first thermal pillar 507 and the second thermal pillar 508 may overlap an edge portion and a central portion respectively of the first semiconductor chip 105, each extending in the second direction (e.g., the Y-direction) beyond long sides of the first semiconductor chip 105. However, the present inventive concept is not limited thereto. For example, each of the first thermal pillar 507 and the second thermal pillar 508 may have various other shapes, including a cylindrical shape. The first thermal pillar 507 and the second thermal pillar 508 may include metal fillers. Each of the first thermal pillar 507 and the second thermal pillar 508 may include a plurality of layers. The first thermal pillar 507 and the second thermal pillar 508 may include, for example, one or more of copper (Cu), nickel (Ni), molybdenum (Mo), platinum (Pt), titanium (Ti), and aluminum (A).

The second molding layer 509 may be disposed on the second redistribution layer 501. The second molding layer 509 may cover lateral surfaces of the second semiconductor chip 503a and the third semiconductor chip 503b and also cover sidewalls of the first thermal pillar 507 and second thermal pillar 508. The second molding layer 509 may fill a space between the second semiconductor chip 503a and the second redistribution layer 501 and a space between the third semiconductor chip 503b and the second redistribution layer 501. The second molding layer 509 may have an upper surface that is coplanar with upper surfaces of the second semiconductor chip 503a and the third semiconductor chip 503b, and with upper surfaces of the first thermal pillar 507 and the second thermal pillar 508. The second molding layer 509 may include a dielectric polymeric material, such as an epoxy molding compound.

The heat radiator 510 may be disposed on the second molding layer 509. The heat radiator 510 may at least partially cover the top surface of the second molding layer 509, the top surfaces of the first thermal pillar 507 and the second thermal pillar 508, and the top surfaces of the second semiconductor chip 503a and the third semiconductor chip 503b. The heat radiator 510 may contact the top surfaces of the second and semiconductor chip 503a and the third semiconductor chip 503b. The heat radiator 510 may contact the top surfaces of the first thermal pillar 507 and the second thermal pillar 508. Therefore, the heat radiator 510 may be electrically/thermally connected to the first thermal pillar 507 and the second thermal pillar 508. The heat radiator 510 may have a plate shape. According to an exemplary embodiment of the present inventive concept, the heat radiator 510 may have a ridged plate shape to increase surface area. The heat radiator 510 may include a metallic material (e.g., copper, tungsten, aluminum, etc.).

According to some exemplary embodiments of the present inventive concept, the first via 40b, the second via 42b, and the third via 44b of the respective first upper redistribution line 40, the second upper redistribution line 42, and the third upper redistribution line 44 disposed in the second redistribution layer 501 may be positioned on regions in which a large quantity of heat is generated from the first semiconductor chip 105. The first vias 40b and the second vias 42b, of the respective first upper redistribution line 40 and second upper redistribution line 42 may directly contact the second surface S2 (e.g., an inactive surface) of the first semiconductor chip 105. The first thermal pillar 507 and the second thermal pillar 508 connected to the heat radiator 510 may be disposed on the first upper redistribution line 40 and the second upper redistribution line 42 respectively. However, the present inventive concept is not limited thereto. For example, the configuration of the upper redistribution line 44 and associated vias 44b may be mirror symmetrical to the configuration of the upper redistribution line 40b and its associated vias 40b. In other words, vias 44b may contact the second surface S2 of the first semiconductor chip 105, and/or the connection line 44a may contact an additional first thermal pillar 507. Thus, the heat generated from the first semiconductor chip 105 may be delivered to the heat radiator 510 through the upper redistribution lines 40, 42, and 44. Accordingly, the heat radiator 510 may receive heat generated from the first semiconductor chip 105, and as a result, it may be possible to dissipate heat confined within the semiconductor package 1000.

The semiconductor package 1000 may be disposed on the board 600. The external terminals 111 may be attached to the board 600. The board 600 may be a printed circuit board (PCB).

Figure 3:
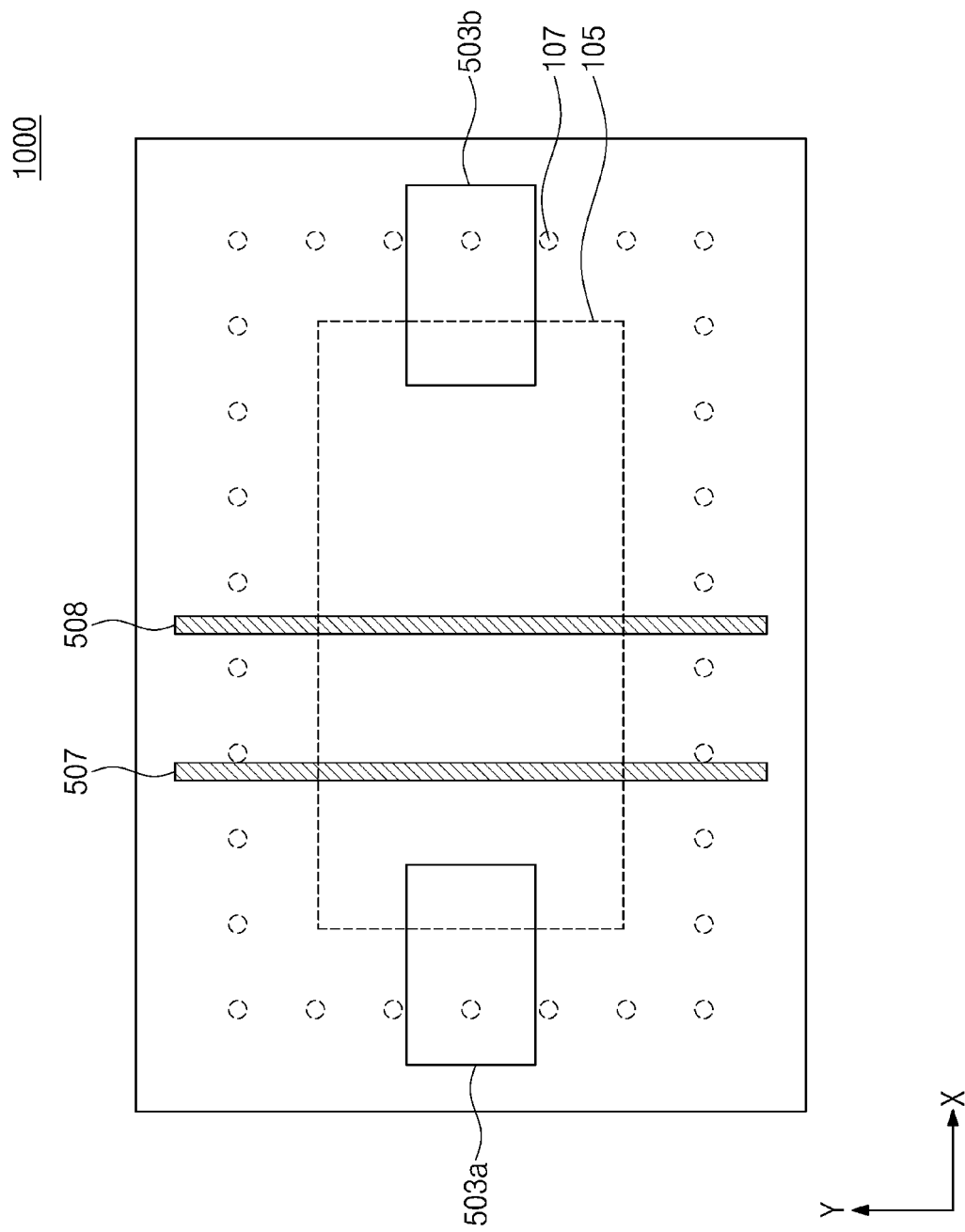
FIG. 3 illustrates a plan view illustrating a semiconductor package according to an exemplary embodiment of the present inventive concept.

FIG. 3 illustrates a plan view illustrating a semiconductor package according to an exemplary embodiment of the present inventive concept.

Referring to FIG. 3, the first connection pillar 107 discussed in the description of FIGS. 1 and 2 may be provided in plural. The plurality of connection pillars 107 may be disposed on an edge of the first redistribution layer 101. When viewed in plan, the plurality of connection pillars 107 may be disposed spaced apart from each other at regular intervals, and may be linearly arranged while surrounding the lateral surfaces of the first semiconductor chip 105. For example, the plurality of connection pillars 107 may at least partially surround the perimeter of the first semiconductor chip 105 in a first direction (e.g., the X-direction) and/or a second direction (e.g., a Y-direction) orthogonal to the first direction (e.g., the X-direction). A plane defined by the first direction (e.g., the X-direction) and the second direction (e.g., the Y-direction) may be substantially parallel to an upper surface of the board 600. However, the present inventive concept is not limited thereto. For example, the plurality of connection pillars 107 may be formed in clusters and/or irregularly spaced.

Figure 4:
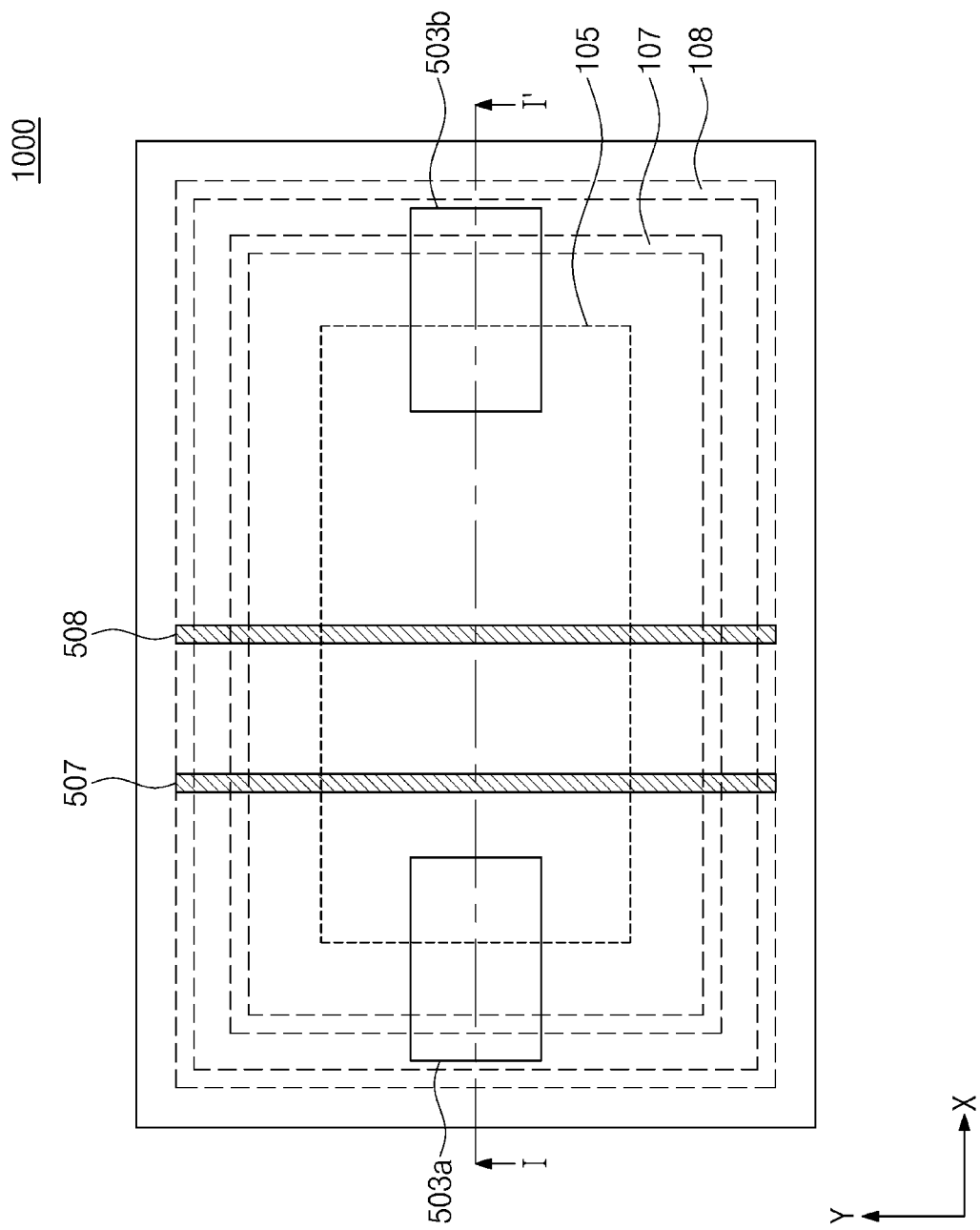
FIG. 4 illustrates a plan view illustrating a semiconductor package according to an exemplary embodiment of the present inventive concept.
Figure 5:
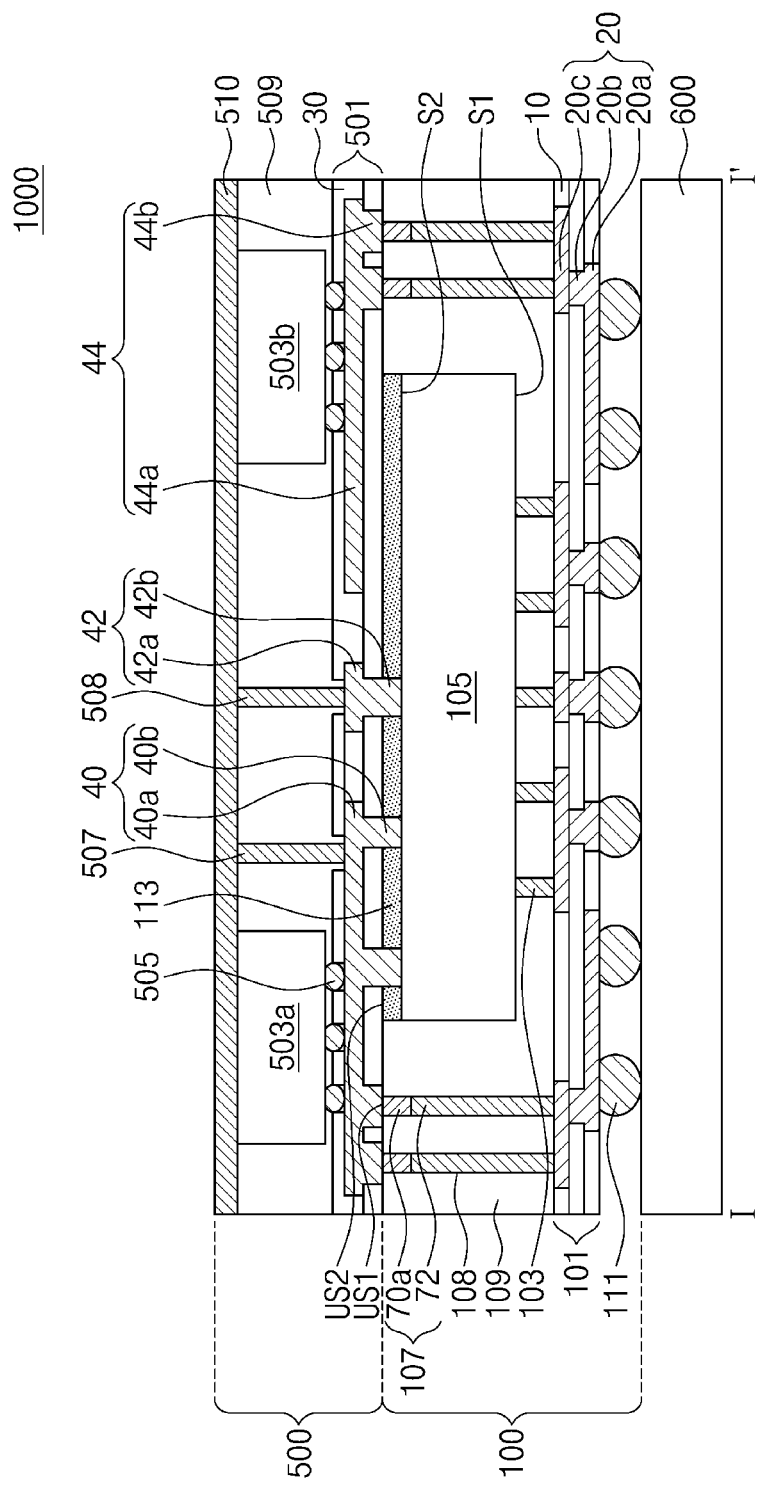
FIG. 5 illustrates a cross-sectional view taken along line I-I' of FIG. 4, illustrating a semiconductor package according to an exemplary embodiment of the present inventive concept.

FIG. 4 illustrates a plan view illustrating a semiconductor package 1000 according to an exemplary embodiment of the present inventive concept. FIG. 5 illustrates a cross-sectional view taken along line I-I' of FIG. 4, illustrating a semiconductor package 1000 according to an exemplary embodiment of the present inventive concept.

Referring to FIGS. 4 and 5, the semiconductor package 1000 may include the first semiconductor package 100 and the second semiconductor package 500. The first semiconductor package 100 may include a first connection pillar 107 and a second connection pillar 108. The first connection pillar 107 and the second connection pillar 108 may be disposed on the edge of the first redistribution layer 101. On the edge of the first redistribution layer 101, the first connection pillar 107 may be spaced apart from the first semiconductor chip 105 in the first direction (e.g., the X-direction) and/or the second direction (e.g., the Y-direction) and may linearly extend around at least one lateral surface of the first semiconductor chip 105. For example, the first connection pillar 107 may surround the perimeter of the first semiconductor chip 105 in a plan view. According to an exemplary embodiment of the present inventive concept, when viewed in plan, the first connection pillar 107 may have a rectangular or annular shape. However, the present inventive concept is not limited thereto. For example, the shape of the first connection pillar 107 may be variously changed and may include discontinuous segments, when viewed in a plan view.

The second connection pillar 108 may be disposed on the edge of the first redistribution layer 101 on a side of the first connection pillar 107. For example, the second connection pillar 108 may be spaced apart from the first connection pillar 107 in the first direction (e.g., the X-direction) and/or the second direction (e.g., the Y-direction). The second connection pillar 108 may linearly extend along the perimeter of the first connection pillar 107. The second connection pillar 108 may surround outer sidewalls of the first connection pillar 107. When viewed in plan, the second connection pillar 108 may have a rectangular or annular shape. However, the present inventive concept is not limited thereto. For example, the shape of the second connection pillar 108 may be variously changed and may include discontinuous segments, when viewed in a plan view. The first connection pillar 107 may be surrounded by the second connection pillar 108. The second connection pillar 108 may have a top surface that is coplanar with a top surface US1 of the first connection pillar 107. The second connection pillar 108 may include, for example, metal fillers. The second connection pillar 108 may include a plurality of layers. The second connection pillar 108 may include, for example, one or more of copper (Cu), nickel (Ni), molybdenum (Mo), platinum (Pt), titanium (Ti), and aluminum (Al).

At least two of the first vias 40b of the first upper redistribution line 40 may penetrate the lowermost second dielectric layer 30 adjacent to the first semiconductor package 100, and may be in contact with the top surface US1 of the first connection pillar 107 disposed on the first side of the first semiconductor chip 105 and with the top surface of the second connection pillar 108 disposed on the first side of the first semiconductor chip 105. The first upper redistribution line 40 may thus be electrically connected to the first connection pillar 107 and the second connection pillar 108. At least two of the third vias 44b of the third upper redistribution line 44 may penetrate the lowermost second dielectric layer 30 adjacent to the first semiconductor package 100, and may be in contact with the top surface US1 of the first connection pillar 107 disposed on the second side of the first semiconductor chip 105 and with the top surface of the second connection pillar 108 disposed on the second side of the first semiconductor chip 105. The third upper redistribution line 44 may thus be electrically connected to the first connection pillar 107 and the second connection pillar 108.

Figure 6:
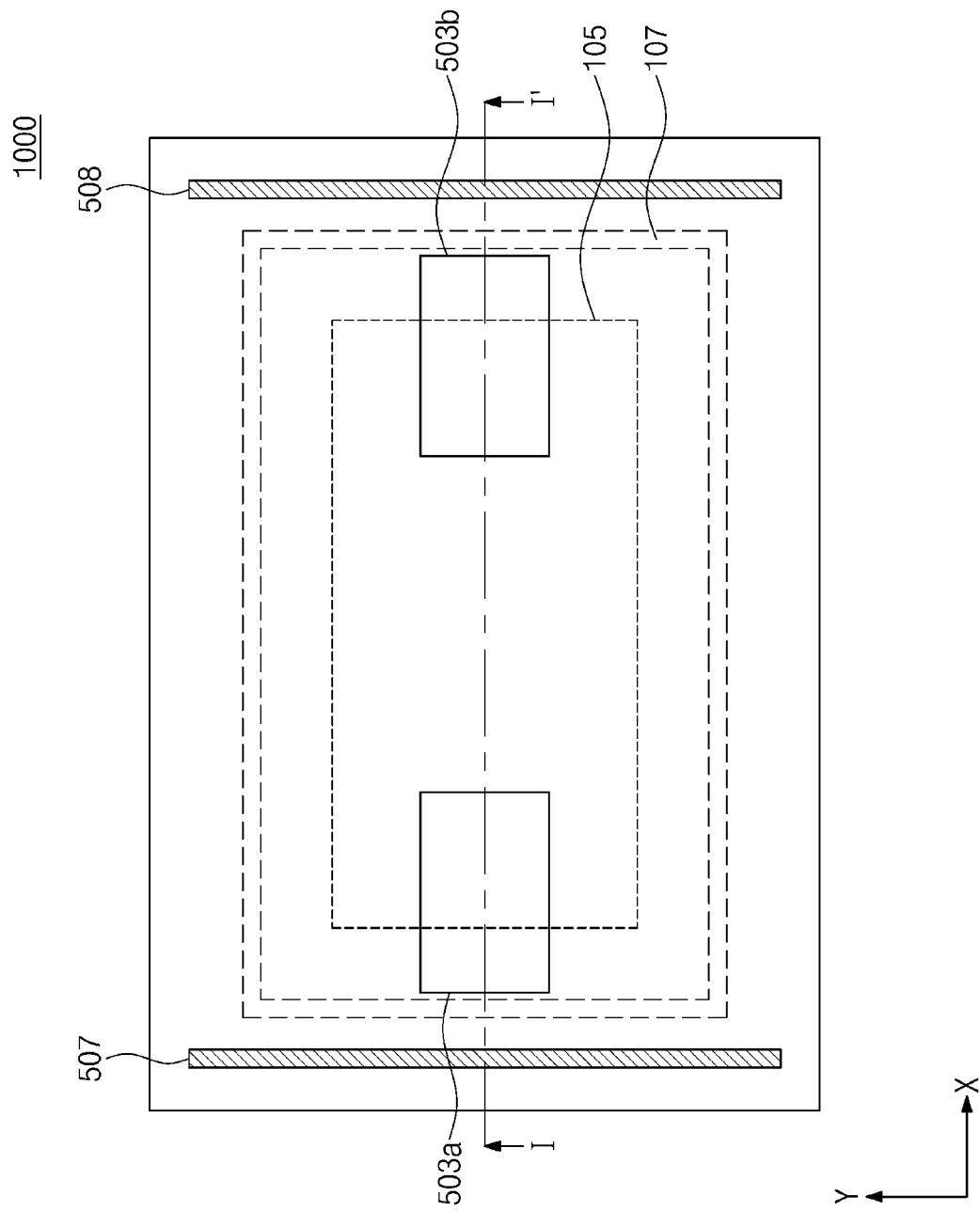
FIG. 6 illustrates a plan view illustrating a semiconductor package according to an exemplary embodiment of the present inventive concept.
Figure 7:
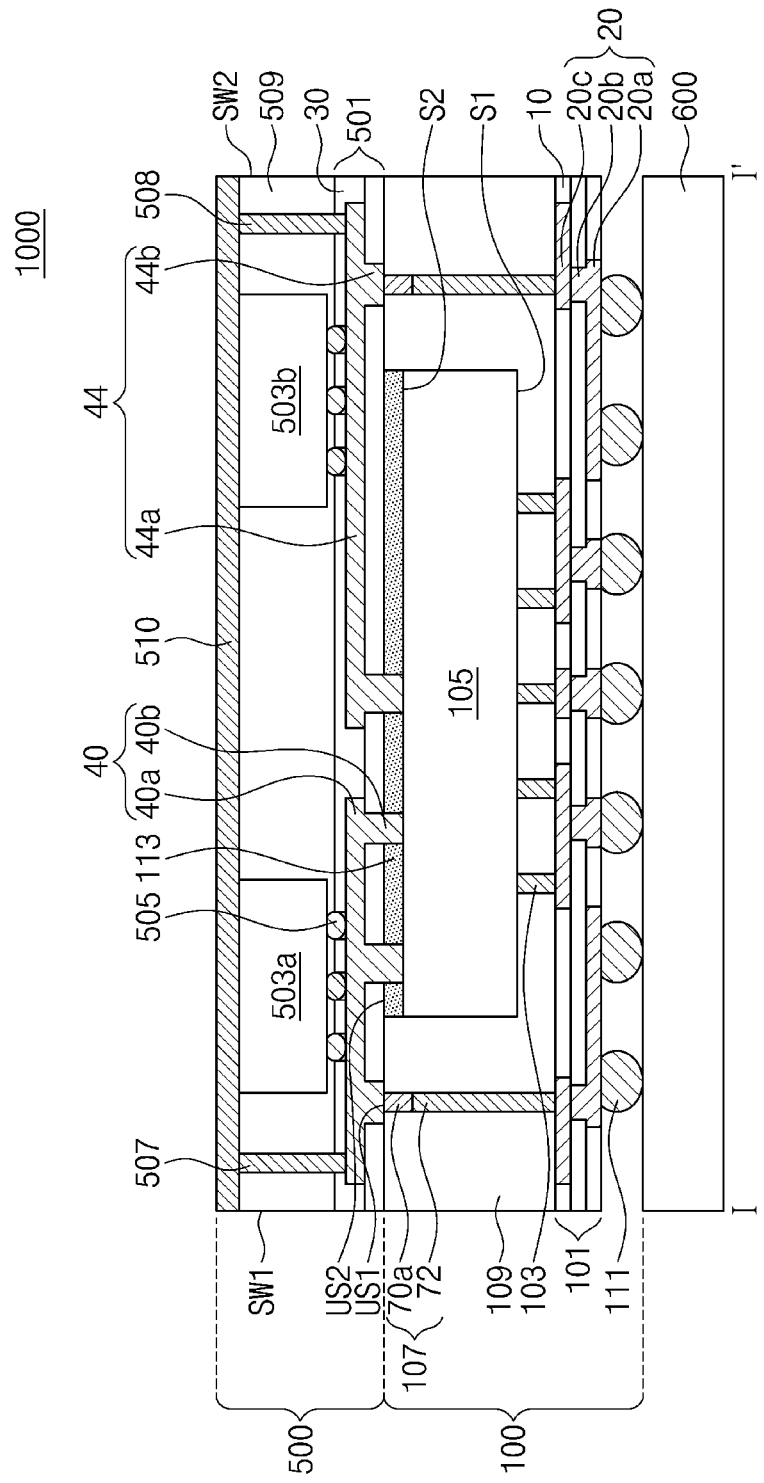
FIG. 7 illustrates a cross-sectional view taken along line I-I' of FIG. 6, illustrating a semiconductor package according to an exemplary embodiment of the present inventive concept.

FIG. 6 illustrates a plan view illustrating a semiconductor package 1000 according to an exemplary embodiment of the present inventive concept. FIG. 7 illustrates a cross-sectional view taken along line I-I' of FIG. 6, illustrating a semiconductor package 1000 according to some exemplary embodiments of the present inventive concepts.

Referring to FIGS. 6 and 7, the present exemplary embodiment of the present inventive concept may not include the second upper redistribution line 42 discussed with reference to FIGS. 1 and 2. The third upper redistribution line 44 may include the connection line 44a and a plurality of the third vias 44b. At least one of the third vias 44b may penetrate the adhesive film 113 and the lowermost second dielectric layer 30 adjacent to the first semiconductor package 100. At least one of the third vias 44b penetrating the lowermost second dielectric layer 30 and the adhesive film 113 may contact the second surface S2 of the first semiconductor chip 105. Thus, the third upper redistribution line 44 may be thermally connected to the first semiconductor chip 105. At least one of the third vias 44b may penetrate the lowermost second dielectric layer 30 adjacent to the first semiconductor package 100, and may contact the top surface US1 of the first connection pillar 107 disposed on the second side of the first semiconductor chip 105. The third upper redistribution line 44 may thus be electrically connected to the first connection pillar 107.

The first thermal pillar 507 may be disposed between the second semiconductor chip 503a and a first lateral surface SW1 of the second molding layer 509 in the first direction (e.g., the X-direction). The first thermal pillar 507 may contact and electrically/thermally connect the first upper redistribution line 40 and the heat radiator 510. The second thermal pillar 508 may be disposed between the third semiconductor chip 503b and a second lateral surface SW2 opposite to the first lateral surface SW1 of the second molding layer 509 in the first direction (e.g., the X-direction). The second thermal pillar 508 may contact and electrically/thermally connect the third upper redistribution line 44 and the heat radiator 510. Each of the first thermal pillar 507 and the second thermal pillar 508 may have a linear shape extending in the second direction (e.g., the Y-direction). For example, in a plan view, the first thermal pillar 507 and the second thermal pillar 508 may be disposed outside of each of the first semiconductor chip 105, the second semiconductor chip 503a, the third semiconductor chip 503b, and the first connection pillar 107. In other words, the first thermal pillar 507 and the second thermal pillar 508 may be disposed at respective edge portions of the semiconductor package 1000, extending substantially parallel thereto. The first upper redistribution line 40 and the third upper redistribution line 44 may be used as thermal pathways through which heat generated from the first semiconductor chip 105 is discharged.

Figure 8:
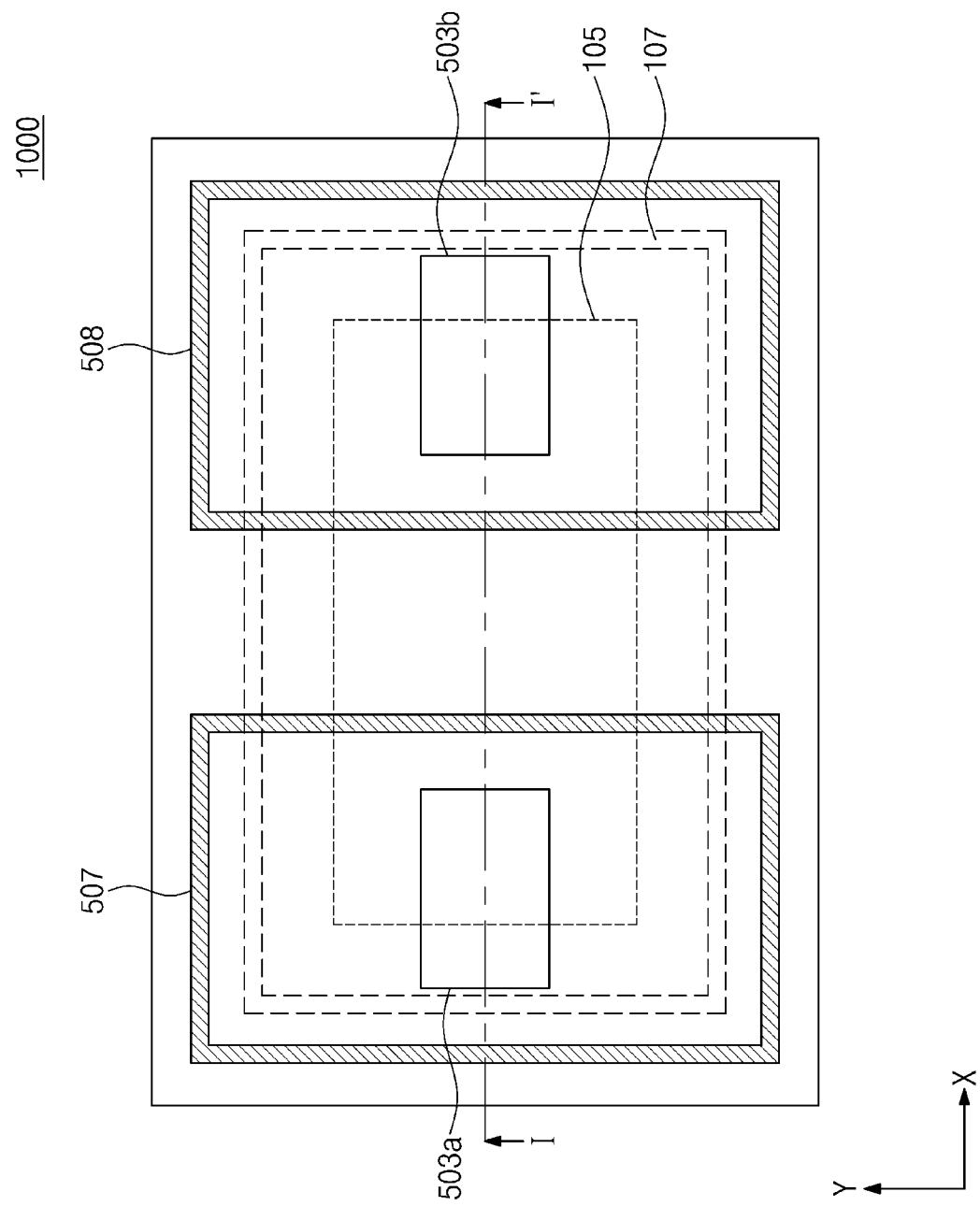
FIG. 8 illustrates a plan view illustrating a semiconductor package according to an exemplary embodiment of the present inventive concept.
Figure 9:
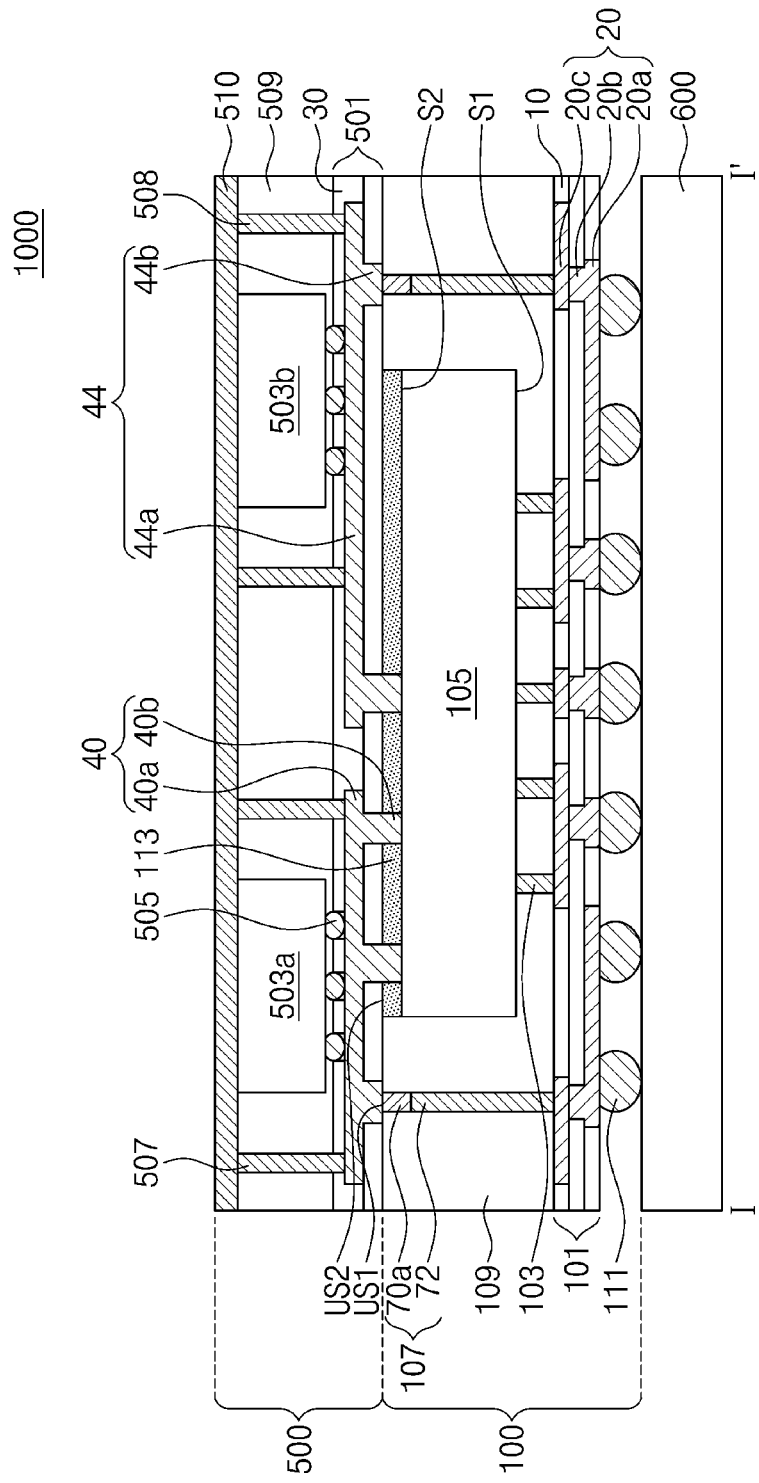
FIG. 9 illustrates a cross-sectional view taken along line I-I' of FIG. 8, illustrating a semiconductor package according to an exemplary embodiment of the present inventive concept.

FIG. 8 illustrates a plan view illustrating a semiconductor package 1000 according to an exemplary embodiment of the present inventive concept. FIG. 9 illustrates a cross-sectional view taken along line I-I' of FIG. 8, illustrating a semiconductor package 1000 according to an exemplary embodiment of the present inventive concept.

Referring to FIGS. 8 and 9, on the second redistribution layer 501, the first thermal pillar 507 may be spaced apart from the second semiconductor chip 503a and disposed to surround lateral surfaces of the second semiconductor chip 503a. The first thermal pillar 507 may have a rectangular annulus shape when viewed in plan. On the second redistribution layer 501, in a cross-sectional view, the second thermal pillar 508 may be spaced apart from the third semiconductor chip 503b and disposed to surround lateral surfaces of the third semiconductor chip 503b. The second thermal pillar 508 may have a rectangular annulus shape when viewed in a plan view. The first thermal pillar 507 may contact the first upper redistribution line 40, and the second thermal pillar 508 may contact the third upper redistribution line 44.

FIGS. 10A to 10G illustrate cross-sectional views taken along line I-I' of FIG. 1, illustrating a method of fabricating a semiconductor package 1000 according to some exemplary embodiments of the present inventive concepts.

Figure 10A:
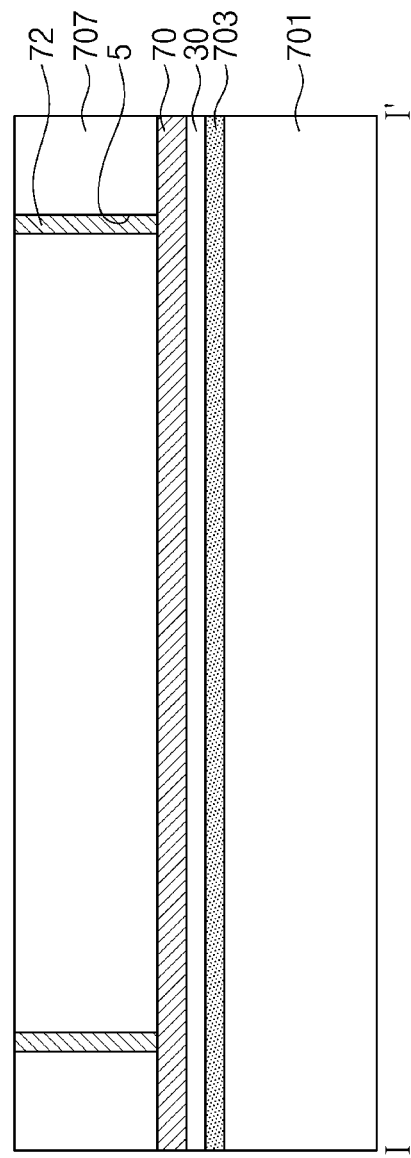
FIGS. 10A, 10B, 10C, 10D, 10E, 10F and 10G illustrate cross-sectional views taken along line I-I' of FIG. 1, illustrating a method of fabricating a semiconductor package according to an exemplary embodiment of the present inventive concept.

Referring to FIG. 10A, a first sacrificial adhesive film 703, a second dielectric layer 30, a seed layer 70, and a mask pattern 707 may be formed on a first support substrate 701. For example, the first support substrate 701 may include glass, plastic, and/or metal. The first sacrificial adhesive film 703 may be formed on the first support substrate 701. The first sacrificial adhesive film 703 may be, for example, an epoxy, a silicon-based dielectric layer, or a tape. The seed layer 70 may be formed on the first sacrificial adhesive film 703. The seed layer 70 may be a layer used for a subsequent plating process. The seed layer 70 may include a metallic material, for example, one or more of copper (Cu), nickel (Ni), molybdenum (Mo), platinum (Pt), titanium (Ti), and aluminum (Al). The seed layer 70 may increase a metal deposition rate in a subsequent plating process. The mask pattern 707 may be formed on the seed layer 70. The mask pattern 707 may have a first opening 5. The first opening 5 may partially expose the seed layer 70. The mask pattern 707 may be, for example, a photoresist pattern.

A second metal pattern 72 may be formed in the first opening 5. A plating process may be performed to form the second metal pattern 72. The second metal pattern 72 may include, for example, Cu.

Figure 10B:
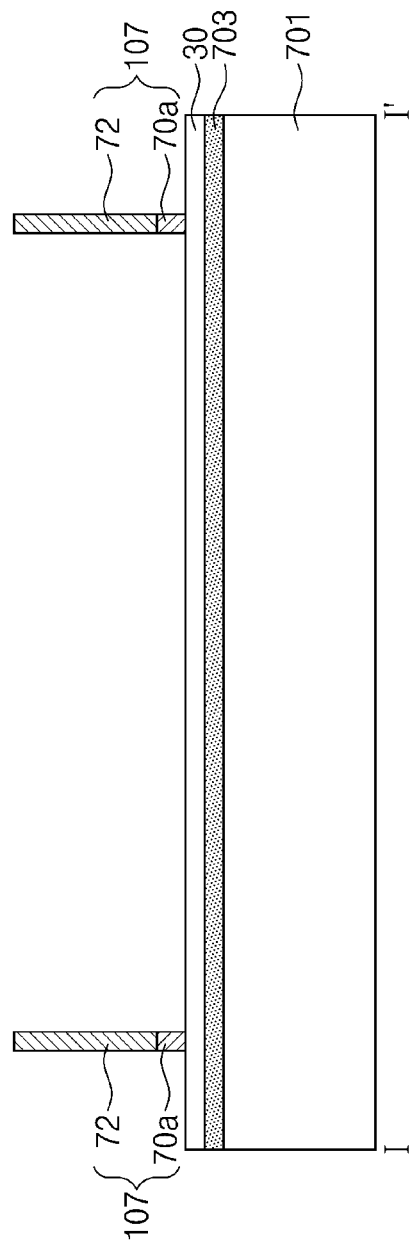

Referring to FIG. 10B, after the formation of the second metal pattern 72, the mask pattern 707 may be removed. The removal of the mask pattern 707 may expose sidewalls of the second metal pattern 72. The mask pattern 707 may be removed by, for example, by an ashing process and/or a strip process. An etching process may be performed in which the second metal pattern 72 is used as an etching mask to etch the seed layer 70. Therefore, a first metal pattern 70a may be formed below the second metal pattern 72. The etching process may be a wet etching process and/or a dry etching process. The formation of the first metal pattern 70a may partially expose a top surface of the second dielectric layer 30. A connection pillar 107 may be formed which has the second metal pattern 72 that is formed by the plating process of FIG. 10A and also has the first metal pattern 70a that is formed by the etching process performed on the seed layer 70. The first connection pillar 107 may be disposed on the second dielectric layer 30.

Figure 10C:
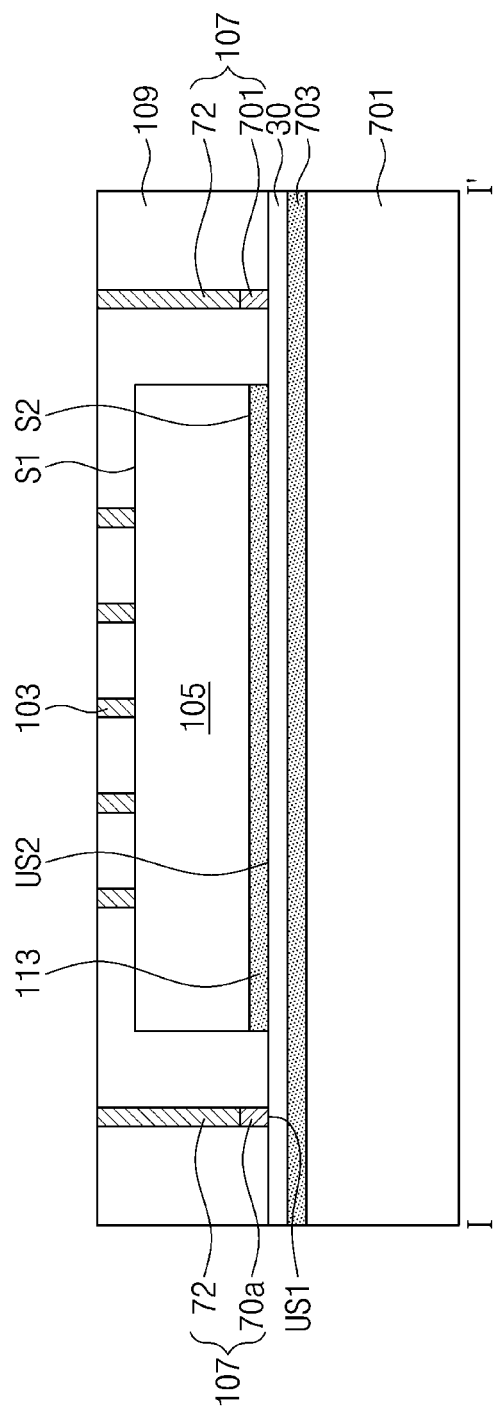

Referring to FIG. 10C, a first semiconductor chip 105 may be provided on the second dielectric layer 30, and first terminals 103 may be formed on a first surface S1 of the first semiconductor chip 105. A plating process may be performed to form the first terminals 103 on the first surface S1 of the first semiconductor chip 105. The first terminals 103 may be formed on an active surface of the first semiconductor chip 105. For example, the first surface S1 may correspond to the active surface of the first semiconductor chip 105. The first semiconductor chip 105 may be attached to the second dielectric layer 30 by the second surface S2. For example, the first semiconductor chip 105 may be attached to the second dielectric layer 30 through an adhesive film 113 provided on the second surface S2 opposite to the first surface S of the first semiconductor chip 105. A top surface US2 of the adhesive film 113 may be attached to the second dielectric layer 30. The second surface S2 may correspond to an inactive surface of the first semiconductor chip 105. The first semiconductor chip 105 may be provided in an inner space of the semiconductor package 1000 surrounded by the first connection pillar 107.

A first molding layer 109 may be formed on the second dielectric layer 30. The first molding layer 109 may cover sidewalls of the first connection pillar 107, lateral surfaces of the first semiconductor chip 105, lateral surfaces of the adhesive film 113, sidewalls of the first terminals 103, and a portion of the first surface S1 of the first semiconductor chip 105. The first molding layer 109 may expose a bottom surface opposite to a top surface US1 of the first connection pillar 107 and may also expose a surface of each of the first terminals 103 opposite to a surface disposed on the first semiconductor chip 105.

Figure 10D:
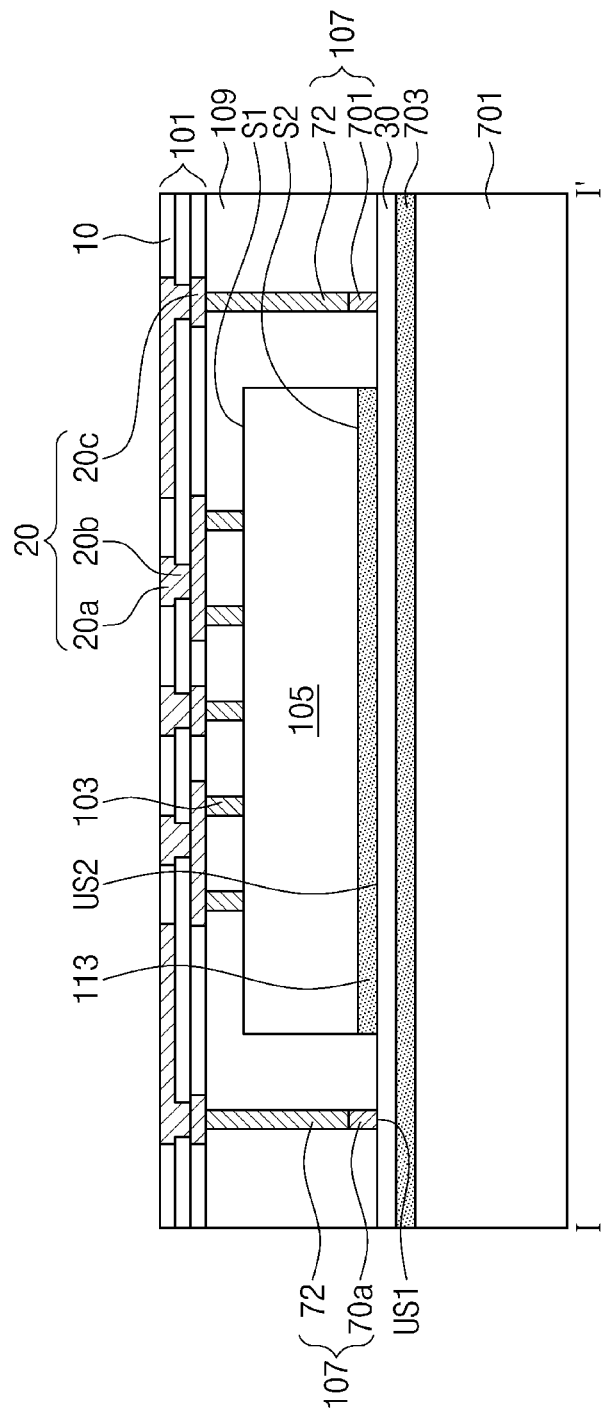

Referring to FIG. 10D, a first redistribution layer 101 may be formed on the first molding layer 109. The first redistribution layer 101 may include at least one first dielectric layer 10 and a plurality of lower redistribution lines 20. The first redistribution layer 101 may be formed by repeatedly performing a process that forms and patterns the first dielectric layer 10 on the first molding layer 109 and a process that forms the lower redistribution line 20 in the patterned first dielectric layer 10.

Figure 10E:
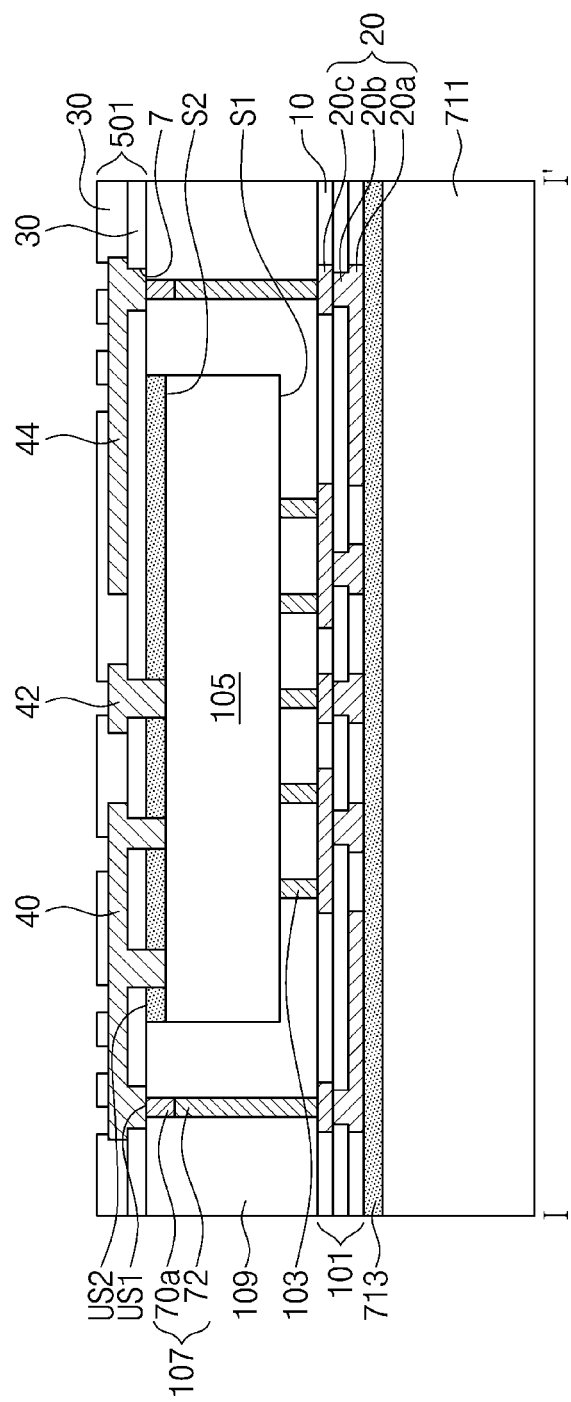

Referring to FIG. 10E, the first sacrificial adhesive film 703 and the first support substrate 701 may be detached from the second dielectric layer 30. For example, the first sacrificial adhesive film 703 may be heated at a temperature equal to or greater than about 170° C. to reduce an adhesive force of the first sacrificial adhesive film 703, which may result in detachment of the first sacrificial adhesive film 703 from the second dielectric layer 30. For another example, the first sacrificial adhesive film 703 may be irradiated with ultraviolet light to cure an adhesive included in the first sacrificial adhesive film 703. This curing may reduce an adhesive force of the first sacrificial adhesive film 703, which may result in detachment of the first sacrificial adhesive film 703 from the second dielectric layer 30. For another example, a chemical may be used to dissolve and remove the first sacrificial adhesive film 703 from the second dielectric layer 30.

A second support substrate 711 may be provided on the first redistribution layer 101. The second support substrate 711 may be attached through a second sacrificial adhesive film 713 to the first redistribution layer 101. The second support substrate 711 may include, for example, glass, plastic, and/or metal. The second sacrificial adhesive film 713 may be, for example, an epoxy, a silicon-based dielectric layer, and/or a tape.

The adhesive film 113 and the second dielectric layer 30 attached thereto may undergo a patterning process to form second openings 7. The second openings 7 may partially expose the top surface US1 of the first connection pillar 107 and the second surface S2 of the first semiconductor chip 105. The patterning process may be performed using a dry etching process or a laser. First upper redistribution line 40, second upper redistribution line 42, and third upper redistribution line 44 may be formed in and on the second dielectric layer 30. The formation of the first upper redistribution line 40, the second upper redistribution line 42, and the third upper redistribution line 44 may include forming a metal layer to cover the second dielectric layer 30 and to fill the second openings 7, and then patterning the metal layer. Portions of the first upper redistribution line 40 and a portion of the second upper redistribution line 42 may be formed in the adhesive film 113.

Another second dielectric layer 30 may be formed to cover the first, upper redistribution line 40, the second upper redistribution line 42, and the third upper redistribution line 44. The another second dielectric layer 30 may be formed by forming, on the second dielectric layer 30 in contact with the adhesive film 113 and the first molding layer 109, another second dielectric layer 30 to cover the first upper redistribution line 40, the second upper redistribution line 42, and the third upper redistribution line 44, and then performing a patterning process to expose portions of the first upper redistribution line 40, the second upper redistribution line 42, and the third upper redistribution line 44. A second redistribution layer 501 may be constituted by the second dielectric layer 30, the first upper redistribution line 40, the second upper redistribution line 42, and the third upper redistribution line 44, and the another second dielectric layer 30. The second redistribution layer 501 may be formed on the first molding layer 109 and the adhesive film 113.

Figure 10F:
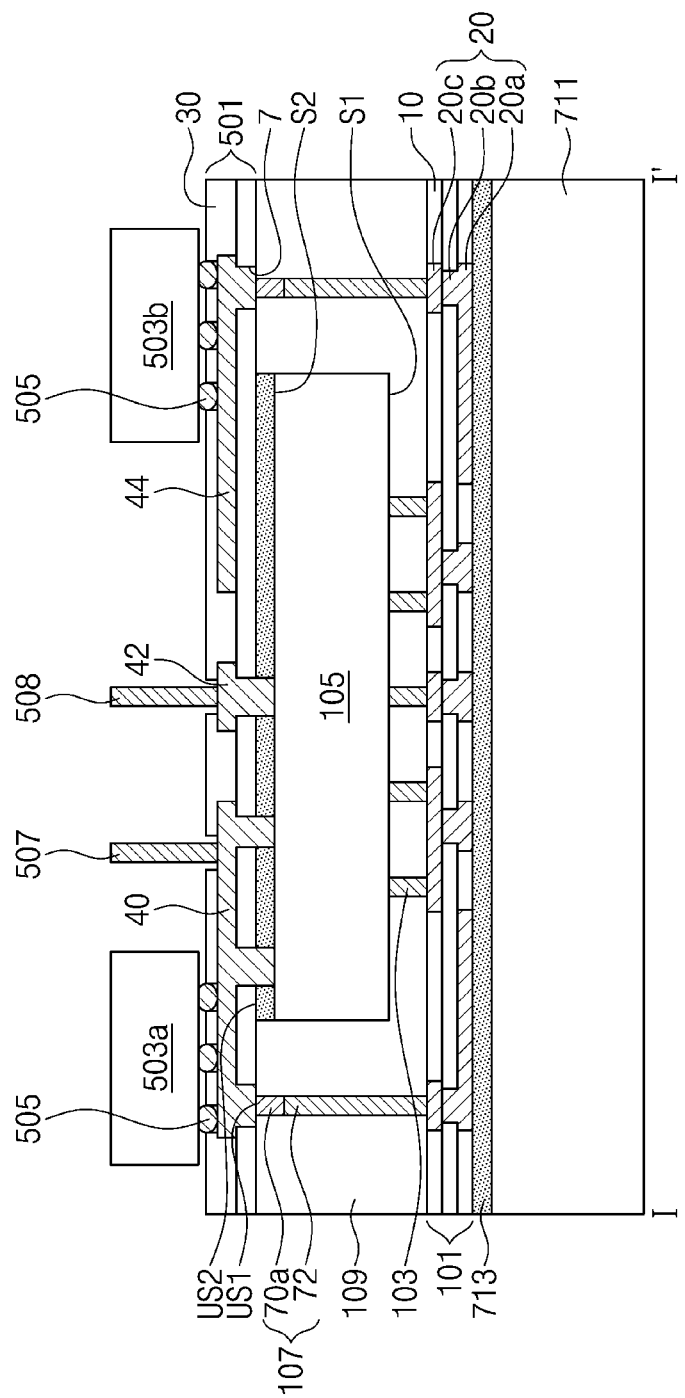

Referring to FIG. 10F, a first thermal pillar 507 and a second thermal pillar 508 may be formed on the second redistribution layer 501. A plating process may be performed to form the first thermal pillar 507 and the second thermal pillar 508. The first upper redistribution line 40 may be provided with the first thermal pillar 507 on its portion exposed by the second dielectric layer 30, and the second upper redistribution line 42 may be provided with the second thermal pillar 508 on its portion exposed by the second dielectric layer 30.

A second semiconductor chip 503a and a third semiconductor chip 503b may be mounted on the second redistribution layer 501. The second semiconductor chip 503a may have on its one surface a plurality of second terminals 505 formed by a soldering process, and the first upper redistribution line 40 may be provided with the second terminals 505 on its portions exposed by the second dielectric layer 30. Thus, the second semiconductor chip 503a may be attached and mounted on the first upper distribution line 40. The third semiconductor chip 503b may have on its one surface a plurality of second terminals 505 formed by a soldering process, and the third upper redistribution line 44 may be provided with the second terminals 505 on its portions exposed by the second dielectric layer 30. Thus, the third semiconductor chip 503b may be attached and mounted on the third upper distribution line 44.

Figure 10G:
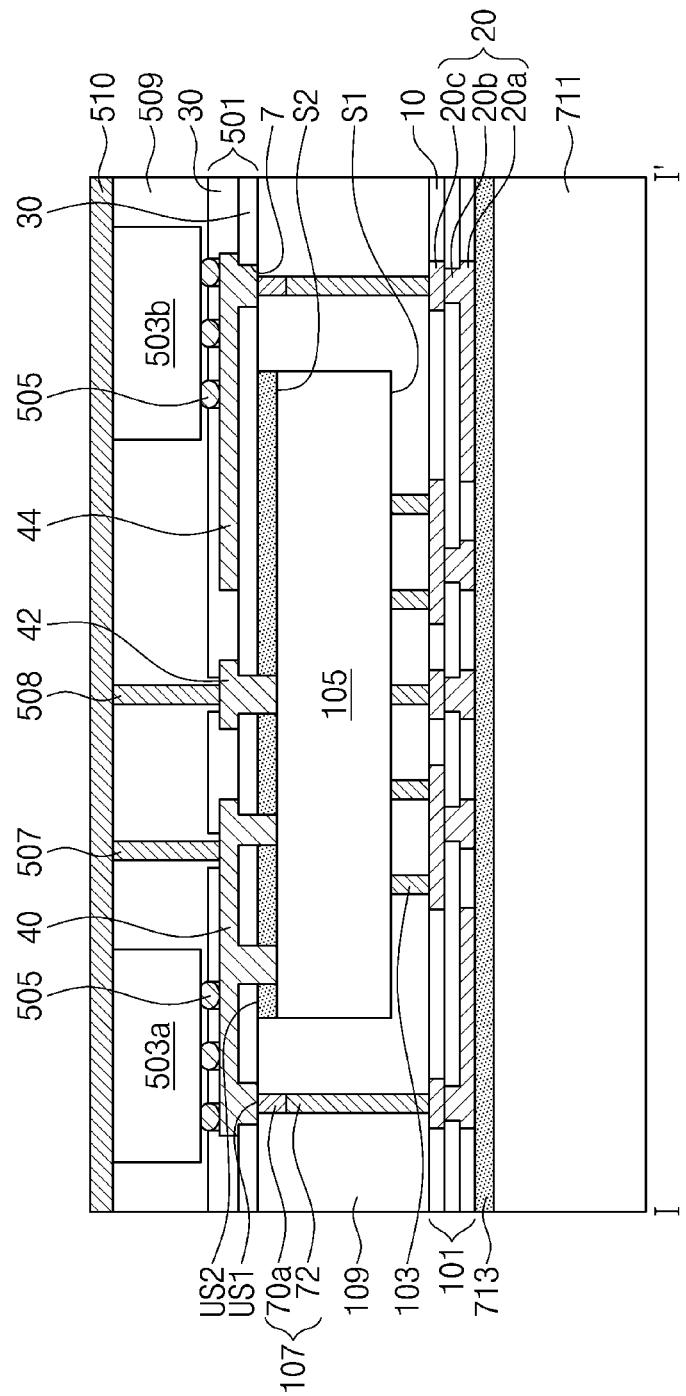

Referring to FIG. 10G, a second molding layer 509 may be formed on the second redistribution layer 501. The second molding layer 509 may cover lateral surfaces of the second semiconductor chip 503a and the third semiconductor chip 503b, sidewalls of the first thermal pillar 507 and the second thermal pillar 508, and a top surface of the second redistribution layer 501. The second molding layer 509 may be formed to fill a space between the second semiconductor chip 503a and the second redistribution layer 501 and a space between the third semiconductor chip 503b and the second redistribution layer 501.

A heat radiator 510 may be formed on the second molding layer 509. The heat radiator 510 may be formed to cover a top surface of the second molding layer 509, top surfaces of the second semiconductor chip 503a and the third semiconductor chip 503b, and top surfaces of the first thermal pillar 507 and the second thermal pillar 508.

Referring back to FIG. 2, the second sacrificial adhesive film 713 and the second support substrate 711 may be detached from the first redistribution layer 101. For example, the second sacrificial adhesive film 713 may be heated at a temperature equal to or greater than about 170° C. to reduce an adhesive force of the second sacrificial adhesive film 713, which may result in detachment of the second sacrificial adhesive film 713 from the first redistribution layer 101. For another example, the second sacrificial adhesive film 713 may be irradiated with ultraviolet light to cure an adhesive included in the second sacrificial adhesive film 713, and this curing may reduce an adhesive force of the second sacrificial adhesive film 713, which may result in detachment of the second sacrificial adhesive film 713 from the first redistribution layer 101. For another example, a chemical may be used to dissolve and remove the second sacrificial adhesive film 713 from the first redistribution layer 101. Accordingly, the detachment of the second sacrificial adhesive film 713 may expose a lowermost first dielectric layer 10 of the first redistribution layer 101 and also expose lower surfaces of the lower redistribution lines 20 disposed in the lowermost first dielectric layer 10.

External terminals 111 may be disposed on a bottom surface of the first redistribution layer 101. The external terminals 111 may be attached to the lower redistribution lines 20 disposed in the lowermost first dielectric layer 10. A soldering process may be performed to form the external terminals 11. The external terminals 111 may be attached to a board 600, and therefore the board 600 may be mounted thereon with a semiconductor package 1000 including the first semiconductor chip 105, the second semiconductor chip 503a, and the third semiconductor chip 503b.

According to some exemplary embodiments of the present inventive concept, a redistribution line disposed in an upper redistribution layer may be connected to a lower semiconductor chip and used as a thermal pathway for heat radiation, and accordingly heat generated from the lower semiconductor chip may be effectively discharged through the redistribution line toward a heat radiator. As a result, a semiconductor package may increase in reliability.

While exemplary embodiments have been described with reference to the figures, it will be understood by those of ordinary skill in the art that various changes in form and details may be made therein without departing from the spirit and scope of the present invention as defined by the following claims.

What is claimed is:

1. A semiconductor package, comprising:
  a first semiconductor package including a first semiconductor chip, wherein the first semiconductor chip includes a first surface and a second surface opposite to the first surface;
  a second semiconductor package on the first semiconductor package, the second semiconductor package including: a second redistribution layer including a redistribution line;
  a second semiconductor chip on the second redistribution layer; and
  a thermal pillar on the second redistribution layer, and a heat radiator on the second semiconductor package and connected to the thermal pillar, wherein the redistribution line is connected to the first semiconductor chip,
  wherein the second redistribution layer further includes a dielectric layer in which the redistribution line is disposed,
  wherein the redistribution line includes:
  a via that penetrates the dielectric layer; and
  a connection line that extends from an end of the via auto a surface of the dielectric layer, wherein the via is in direct contact with the second surface of the first semiconductor chip.

2. The semiconductor package of claim 1, wherein the thermal pillar is connected with the redistribution line and the heat radiator.

3. The semiconductor package of claim 1, wherein the second semiconductor package farther includes a molding layer that covers lateral surfaces of the second semiconductor chip and sidewalk of the thermal pillar,
wherein a top surface of the molding layer is coplanar with a top surface of the second semiconductor chip and with a top surface of the thermal pillar, and
the heat radiator at least partially covers the top surface of the molding layer, the top surface of the second semiconductor chip, and the top surface of the thermal pillar.

4. The semiconductor package of claim 1, wherein, when viewed in a plan view, the thermal pillar has a linear shape extending in one direction.

5. The semiconductor package of claim 1, wherein, when viewed in a plan view, the thermal pillar has a rectangular annulus shape spaced apart from the second semiconductor chip, the rectangular annulus shape at least partially surrounding lateral surfaces of the second semiconductor chip in the plan view.

6. The semiconductor package of claim 1, wherein the first semiconductor package further includes a molding layer that covers lateral surfaces of the first semiconductor chip,
wherein the molding layer has a top surface adjacent to the second semiconductor package, and
the top surface of the molding layer is located at a level higher than a level of the second surface of the first semiconductor chip.

7. The semiconductor package of claim 6, wherein the first semiconductor package further includes a first redistribution layer and a connection pillar on the first redistribution layer, the connection pillar being spaced apart from the first semiconductor chip and at least partially surrounding lateral surfaces of the first semiconductor chip,
wherein a top surface of the connection pillar is coplanar with the top surface of the molding layer.

8. The semiconductor package of claim 1, further comprising an adhesive film between the second redistribution layer and the second surface of the first semiconductor chip.

9. The semiconductor package of claim 1, further comprising a plurality of terminals between a first redistribution layer and the first surface of the first semiconductor chip.

10. The semiconductor package of claim 1, wherein the first surface of the first semiconductor chip is an active surface, and the second surface of the first semiconductor chip is an inactive surface.

11. A semiconductor package, comprising:
a first semiconductor package including a first semiconductor chip, wherein the first semiconductor chip includes a first surface and a second surface opposite to the first surface;
a second semiconductor package on the first semiconductor package, the second semiconductor package including: a second redistribution layer including a redistribution line;
a second semiconductor chip on the second redistribution layer; and
a thermal pillar on the second redistribution layer, and a heat radiator on the second semiconductor package and connected to the thermal pillar, wherein the redistribution line is connected to the first semiconductor chip,
wherein the second semiconductor package further includes a plurality of second terminals between the second semiconductor chip and the second redistribution layer,
wherein the second terminals are connected with the redistribution line.

12. A semiconductor package, comprising:
a first semiconductor package including a first semiconductor chip, wherein the first semiconductor chip includes a first surface and a second surface opposite to the first surface;
a second semiconductor package on the first semiconductor package, the second semiconductor package including: a second redistribution layer including a redistribution line;
a second semiconductor chip on the second redistribution layer; and
a thermal pillar on the second redistribution layer, and a heat radiator on the second semiconductor package and connected to the thermal pillar, wherein the redistribution line is connected to the first semiconductor chip,
wherein the first semiconductor package further includes a connection pillar on a first redistribution layer on one side of the first semiconductor chip, the connection pillar being in contact with the redistribution line of the second redistribution layer.

* * * * *